(12) United States Patent
Nimbalker et al.

(10) Patent No.: US 7,783,952 B2
(45) Date of Patent: Aug. 24, 2010

(54) METHOD AND APPARATUS FOR DECODING DATA

(75) Inventors: Ajit Nimbalker, Schaumburg, IL (US); Yufei W. Blankenship, Kildeer, IL (US); Brian K. Classon, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 1020 days.

(21) Appl. No.: 11/530,211

(22) Filed: Sep. 8, 2006

(65) Prior Publication Data
US 2008/0072122 A1    Mar. 20, 2008

(51) Int. Cl.
*H03M 13/00* (2006.01)
(52) U.S. Cl. .................. 714/755; 714/788; 714/762; 714/786; 714/777
(58) Field of Classification Search .......... 714/755, 714/786, 788, 762, 777
See application file for complete search history.

(56) References Cited

U.S. PATENT DOCUMENTS

| | | | | |
|---|---|---|---|---|
| 6,526,538 | B1 * | 2/2003 | Hewitt ..................... | 714/780 |
| 6,718,503 | B1 * | 4/2004 | Lerner et al. .............. | 714/755 |
| 7,458,009 | B2 * | 11/2008 | Yu et al. .................. | 714/800 |
| 2002/0023246 | A1 * | 2/2002 | Jin .......................... | 714/755 |
| 2002/0040460 | A1 * | 4/2002 | Choi et al. ................ | 714/755 |
| 2005/0111564 | A1 * | 5/2005 | Kramer et al. ............ | 375/265 |
| 2005/0216819 | A1 | 9/2005 | Chugg et al. | |
| 2006/0031737 | A1 | 2/2006 | Chugg et al. | |
| 2009/0259915 | A1 * | 10/2009 | Livshitz et al. .......... | 714/758 |

FOREIGN PATENT DOCUMENTS

WO    WO 2005/096510 A1    10/2005

OTHER PUBLICATIONS

Mansour, et al., "High-throughput LDPC decoders," IEEE Trans. on VLSI, vol. 11, No. 6, pp. 976-996, Dec. 2003.
Chugg, et al., "A new class of turbo-like codes with universally good performance and high-speed decoding," MILCOM, 2005.
Nimbalker, et al,"Inter-window shuffle interleavers for high throughput turbo decoding," 3rd Intl. Symp. On Turbo Codes and Rel. Topics, Brest (France) pp. 355-358, Sep. 2003.
Tarable, et al., "Mapping of interleaving laws to parallel turbo decoder architectures," IEEE Trans. On Information Theory, vol. 50, Issue 9 Sep. 2004, pp. 2002-2009.
Nimbalker, et al, "Contention-Free Interleavers" Motorla Labs and University of Notre Dame.

* cited by examiner

*Primary Examiner*—Guy J Lamarre

(57) ABSTRACT

A method and apparatus for decoding data is provided herein to show how to turbo decode LDPC codes that contain a partial dual diagonal parity-check portion, and how to avoid memory access contentions in such a turbo decoder. During operation, a decoder will receive a signal vector corresponding to information bits and parity bits and separate the received signal vector into two groups, a first group comprising signals corresponding to the information bits and one or more parity bits, a second group comprising a remainder of the parity bits. The first group of received signals is passed to a first decoder and the second group of received signals is passed to a second decoder. The decoders are separated by an interleaver and a deinterleaver. Iterative decoding takes place by passing messages between the decoders, through the interleaver and the deinterleaver, and producing an estimate of the information bits from the output of the first decoder.

20 Claims, 10 Drawing Sheets

200

An encoding structure for the (12,6) code defined by the H matrix in (2).

300

GRA-like encoder of (12,6) code defined by the H matrix in (2).

400

A Generalized Repeat Accumulate (GRA)-like encoder of parity-check matrices with a partial dual-diagonal parity portion.

500

A turbo-like decoder of an LDPC code.

A graph-model of a turbo-like decoder of structured LDPC codes.

A vectorized GRA-like encoder structure of an LDPC code based upon a model matrix $H_{bm}$. Each element in the input and output is a $z \times 1$ vector.

A method of implementing a vectorized GRA-like encoder. The dotted region indicates two stages of interleaving – cyclic shifting and vector permutations. The T's are temporary variables.

900

Block diagram of a high-throughput turbo-like decoder of a structured LDPC code.

1000

CF interleaver for high throughput decoding of structured LDPC codes.

METHOD AND APPARATUS FOR DECODING DATA

FIELD OF THE INVENTION

The present invention relates generally to decoding data and in particular, to a method and apparatus for decoding data using low-density parity-check (LDPC) codes.

BACKGROUND OF THE INVENTION

Digital data transmissions over wired and wireless channels may be corrupted, for instance, by noise in the channel, by interference from other transmissions, or by other environmental factors. Even with clear communication channels, which lend themselves to high data rates, it may not be possible to appropriately decode the data stream with the requisite error rates. In order to solve this problem, many communication systems employ error-correction techniques to aid in communication.

One technique utilized for error correction is the Low-density parity-check (LDPC) codes, which is used to provide powerful protection of the information vector to be transmitted.

An LDPC code is a linear block code specified by a parity-check matrix H. In general, an LDPC code is defined over GF(q), $q \geq 2$. If q=2, the code is binary. As with all linear block codes, a k-bit information vector $s_{1 \times k}$ is generally encoded by the code generator matrix $G_{k \times n}$ to become an n-bit codeword $x_{1 \times n}$, and the code rate is r=k/n. The codeword x is sent by the transmitter through a noisy channel, and at the receiver the received signal vector y is passed to the decoder to estimate the information vector $s_{1 \times k}$.

Given an n-dimensional space, the rows of G span the k-dimensional codeword subspace C, and the rows of the parity-check matrix $H_{m \times n}$ span the m-dimensional dual space $C^\perp$, where m=n−k. Since x=sG and $GH^T=0$, it follows that $xH^T=0$ for all codewords in subspace C, where "T" denotes matrix transpose. In the discussion of LDPC codes, this is generally written as $$Hx^T = 0^T, \quad (1)$$

where 0 is a row vector of all zeros, and the codeword x=[s p]=[$s_0, s_1, \ldots, s_{k-1}, p_0, p_1, \ldots, p_{m-1}$], where $p_0, \ldots p_{m-1}$ are the parity-check bits; and $s_0, \ldots s_{k-1}$ are the systematic bits, equal to the information bits, or data within the information vector.

For an LDPC code, the density of H is low, i.e., there are only a small percentage of 1's in H, allowing good error-correcting performance and simple decoding when compared to a high-density H. An H matrix can be also described by a bipartite graph. Each 1 in H defines an edge (i.e., a connection between a variable node and a check node) in the bipartite graph, each column in H corresponds to a variable node in the bipartite graph, and each row in H corresponds to a check node in the bipartite graph.

An example of H matrix is shown below to illustrate the relationship between the parity-check matrix, the parity-check equations, and the bipartite graph. Let an n=12, rate-½ code be defined by $$H = [H_s | H_p] = \begin{bmatrix} 1 & 0 & 1 & 0 & 0 & 0 & | & 1 & 1 & 0 & 0 & 0 & 0 \\ 0 & 1 & 0 & 0 & 1 & 0 & | & 0 & 1 & 1 & 0 & 0 & 0 \\ 0 & 0 & 1 & 0 & 0 & 1 & | & 1 & 0 & 1 & 1 & 0 & 0 \\ 1 & 0 & 0 & 1 & 0 & 0 & | & 0 & 0 & 0 & 1 & 1 & 0 \\ 0 & 1 & 0 & 0 & 1 & 0 & | & 0 & 0 & 0 & 0 & 1 & 1 \\ 0 & 0 & 0 & 1 & 0 & 1 & | & 1 & 0 & 0 & 0 & 0 & 1 \end{bmatrix} \Big\} m, \quad (2)$$

with the left side portion corresponding to k (=6) information bits s, the right side portion corresponding to m (=6) parity-check bits p. Applying (1), the H in (2) defines six parity-check equations as follows:

$$\begin{cases} x_0 + x_2 + x_6 + x_7 = 0 \\ x_1 + x_4 + x_7 + x_8 = 0 \\ x_2 + x_5 + x_6 + x_8 + x_9 = 0 \\ x_0 + x_3 + x_9 + x_{10} = 0 \\ x_1 + x_4 + x_{10} + x_{11} = 0 \\ x_3 + x_5 + x_6 + x_{11} = 0 \end{cases} \quad (3)$$

H can also be described by the bipartite graph shown in FIG. 1.

An LDPC decoder can contain a very high level of parallelism. To help keep routing and memory management issues in check, many LDPC codes are "architecture-aware" or "structured" to facilitate efficient LDPC decoding via iterative message passing algorithms such as the standard belief propagation (SBP) or layered belief propagation (LBP). Structured LDPC codes possessing a partial dual-diagonal structure have been adopted in standards such as IEEE 802.16e and IEEE draft 802.11n.

Turbo decoding of an LDPC code may be desired. However, it is not clear how to turbo decode LDPC codes that contain a partial dual diagonal parity-check portion. In addition, it is not clear how to build a turbo decoder for a structured LDPC code decoder that avoids contentions in memory access. In a high throughput decoder several processors operate in parallel, leading to multiple read/write requests from several memory banks. In such decoders, memory access contentions (or memory access conflicts or collisions) occur when more than one message is to be written to or read from the same memory bank at the same time. Extra hardware or excessive storage is required to resolve these conflicts. Therefore, a method and apparatus for turbo like encoding and decoding algorithm is needed to handle LDPC codes with a partial dual diagonal structure, and a turbo like decoding (TLD) algorithm is needed where a contention-free interleaver is used to enable parallel memory accesses.

DETAILED DESCRIPTION OF THE DRAWINGS

Figure 1:
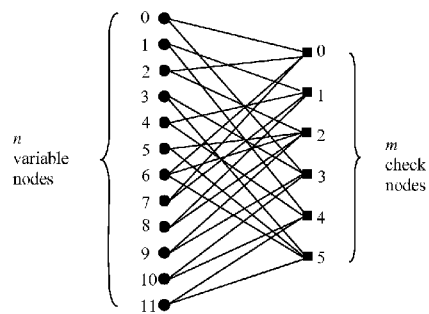
FIG. 1 illustrates the bipartite graph of an (12, 6) H matrix.

In order to address the above-mentioned need, a method and apparatus for decoding data is provided herein. During operation, a decoder will receive a signal vector corresponding to information bits and parity bits and separate the received signal vector into two groups, a first group comprising signals corresponding to the information bits and one or more parity bits, a second group corresponding to a remainder of the parity bits. The first group of received signals is passed to a first decoder and the second group of received signals is passed to a second decoder. The decoders are separated by an interleaver and a de-interleaver. Iterative decoding takes place by passing messages between the decoders, through the interleaver and the de-interleaver, and producing an estimate of the information bits from the output of the first decoder.

The present invention encompasses a method for estimating an information vector containing information bits at a receiver. The method comprises the steps of receiving a signal vector corresponding to information bits and parity bits, and separating the received signal vector into two groups, a first group comprising signals corresponding to the information bits and one or more parity bits, a second group corresponding to a remainder of the parity bits. The first group is passed to a first decoder and the second group is passed to a second decoder. Iterative decoding takes place by passing messages between the decoders, where the decoders are separated by an interleaver and a de-interleaver. Finally, an estimate of the information vector is produced from the output of the first decoder.

The present invention additionally encompasses an apparatus for estimating an information vector containing information bits at a receiver. The apparatus comprises a receiver receiving a signal vector corresponding to information bits and parity bits, a channel LLR (log-likelihood ratio) distributor separating the received signal vector into two groups, a first group comprising signals corresponding to the information bits and one or more parity bits, and a second group corresponding to a remainder of the parity bits, a first decoder receiving the first group of signals, and a second decoder receiving the second group of signals. The first and the second decoders iteratively decode the received signal vector by passing messages between the decoders. Additionally, the decoders are separated by an interleaver and a de-interleaver, and the first decoder outputs an estimate of the information vector.

A Turbo-Like Decoder for LDPC Codes

An LDPC code may be constructed where the entire parity-check portion of the H matrix is dual-diagonal such as shown in (4), possibly after row and column permutation of the original parity-check matrix H. With such a parity-check portion, the code is equivalent to a serially concatenated turbo code with the outer code being a 2-state convolutional code. Such an LDPC code is a Generalized Repeat Accumulate code $$H'_p = \begin{bmatrix} 1 & 1 & 0 & 0 & 0 & 0 \\ 0 & 1 & 1 & 0 & 0 & 0 \\ 0 & 0 & 1 & \ddots & 0 & 0 \\ 0 & 0 & 0 & \ddots & 1 & 0 \\ \vdots & \vdots & \vdots & & 0 & 1 & 1 \\ 0 & 0 & 0 & 0 & 0 & 1 \end{bmatrix} \Big\} m. \qquad (4)$$

The encoding procedure for LDPC codes with partial dual-diagonal structure is illustrated below using (2) where the first column of $H_p$ is non-dual-diagonal. Rewrite the parity-check equations of (3) into (5). Note that the first k (=6) bits in the codeword are equal to the k information bits due to systematic encoding (i.e., $x_0$, $x_1$, $x_2$, $x_3$, $x_4$, $x_5$ are known). The set of equations in (5) may be solved to obtain the remaining bits of the codeword.

$$\begin{aligned} x_7 &= (x_0 + x_2 + x_6) \\ x_8 + x_7 &= (x_1 + x_4) \\ x_9 + x_8 &= (x_2 + x_5 + x_6) \\ x_{10} + x_9 &= (x_0 + x_3) \\ x_{11} + x_{10} &= (x_1 + x_4) \\ x_{11} &= (x_3 + x_5 + x_6) \end{aligned} \qquad (5)$$

The encoding can be performed in three steps:

Step 1. The information bits $[s_0, s_1, s_2, s_3, s_4, s_5]$ form the systematic portion of codeword, i.e., $x_0=s_0$, $x_1=s_1$, $x_2=s_2$, $x_3=s_3$, $x_4=s_4$, $x_5=s_5$.

Step 2. The systematic portion of the codeword is used to compute the parity bit corresponding to the non-dual-diagonal portion of $H_p$, which is the first parity bit $x_6$ for (2). Mathematically, this is done by adding all the parity-check equations in (5), where all unknown variables cancel except $x_6$.

Step 3. The parity bits corresponding to the partial dual-diagonal portion, which are $(x_7, x_8, x_9, x_{10}, x_{11})$ for (2), are obtained through successive back-substitution using the parity-check equations in (5).

In general, an LDPC code with a substantial dual-diagonal parity portion can be encoded via the following three steps:

Step 1. Fill the systematic portion of codeword with a direct copy of the information bits $[s_0, s_1, s_2, s_3, \ldots s_{k-1}]$, i.e., $x_0=s_0$, $x_1=S_1$, $x_2=s_2$, $\ldots x_{k-1}=s_{k-1}$.

Step 2. Compute the parity bits related to the non-dual-diagonal parity portion (i.e., solve the corresponding parity-check equations).

Step 3. Compute the parity bits related to the partial dual-diagonal parity portion using a successive back-substitution and the results of Step 1 and Step 2.

In the encoding procedure described above Step 2 depends on the actual non-dual-diagonal parity portion. In general, there can be more than one parity bit corresponding to non dual-diagonal parity portion. However, without loss of generality, in the rest of this report, only one bit is assumed. The rest of the section focuses on Step 3.

Figure 2:
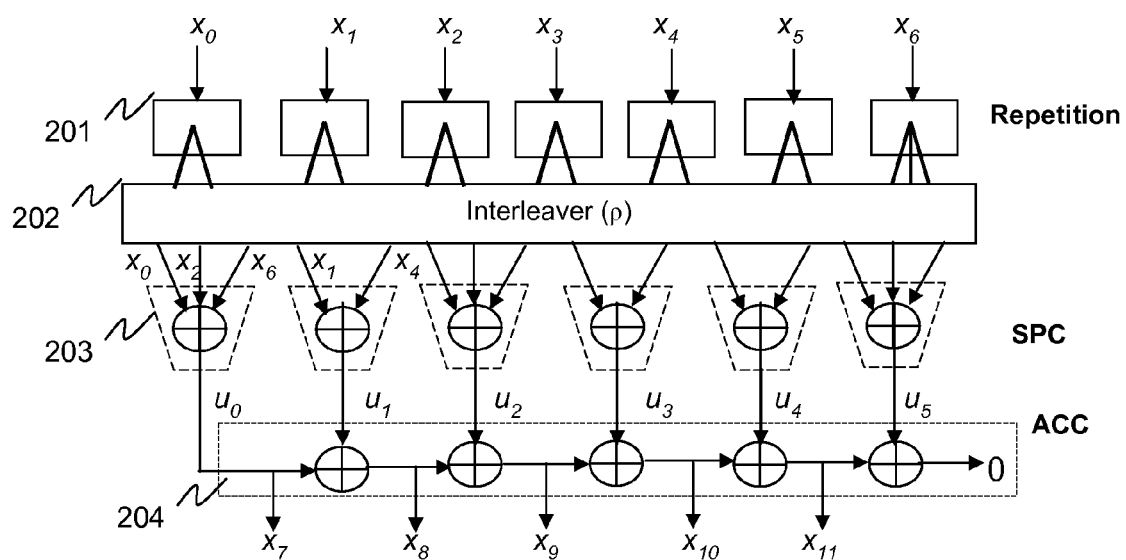
FIG. 2 illustrates the encoding structure for the (12,6) code.

FIG. 2 is a block diagram of encoder 200. In FIG. 2, first the input bits $[x_0, x_1, x_2, x_3, x_4, x_5, x_6]$ (including a computed parity bit $x_6$) are repeated via repetition encoder 201 (only one labeled) according to the number of times each bit appears on the right-hand-side (RHS) of (5). The output of the repetition encoder 201 is suitably rearranged (via an interleaver 202) so that the bits can be grouped in the order they appear on the RHS of (5). XOR-gates 203 (only one labeled) immediately below the interleaver represent Single Parity-Check (SPC) codes, which compute the right hand side of (5). The XOR-gates on the bottom represent an Accumulator (ACC) 204 which performs the back substitution on the left hand side of (5). Accumulator 204 is equivalent to a 2-state convolutional encoder (or a differential encoder) with generator polynomial $G(D)=1/1+D$. It is noted that at the beginning of encoding, accumulator 204 is in zero state. Also, it is noted that the last output of accumulator 204 is always 0 (and hence this 0 is not transmitted), because the sum of all values on the LHS (and thus the RHS) of (5) is zero, i.e., every column in the partial dual-diagonal structure has weight 2.

Figure 3:
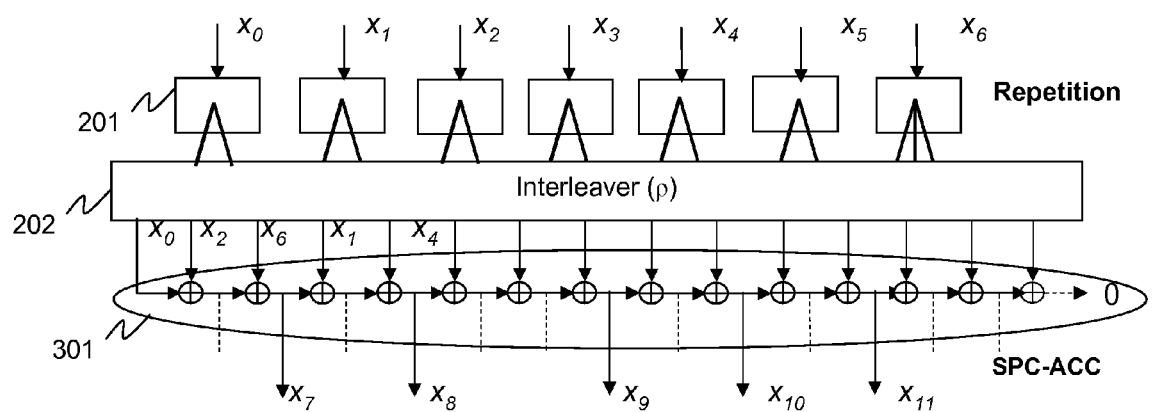
FIG. 3 is illustrates the GRA-like encoder of the (12,6) code.

FIG. 3 is a block diagram of encoder 300 where the SPC and ACC are combined to form an SPC-ACC encoder, which is equivalent to an ACC encoder with irregular puncturing. Dashed lines indicate punctured parity bits. The encoder diagrams in FIG. 2 and FIG. 3 are very similar to that of a Generalized Repeat Accumulate (GRA) code. However, it is to be noted that a GRA code computes all the parity bits via back substitution, while the above-described technique pre-computes a parity bit ($x_6$) in a non-GRA fashion, and applies a GRA-like encoder to obtain the remaining parity bits. Note that in FIG. 3 (similar to FIG.2), the SPC-ACC encoder always accumulates to zero. Thus in the receiver, the SPC-ACC decoder is designed for an SPC-ACC that accumulates to zero.

Figure 4:
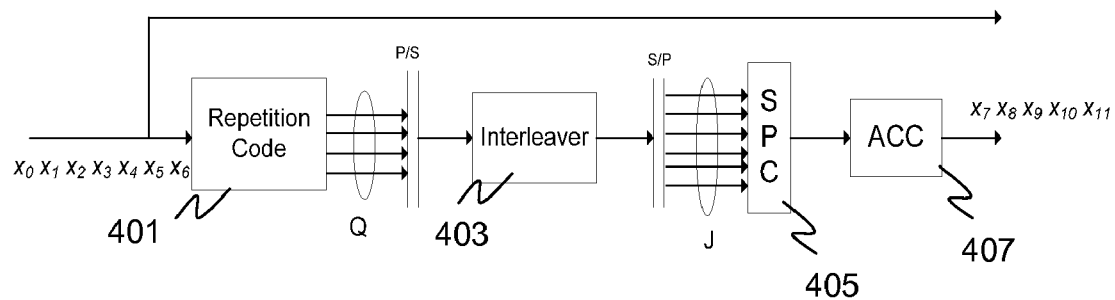
FIG. 4 is the block diagram of the GRA-like encoder of the (12,6) code.

The encoding procedure shown in FIG. 2 and FIG. 3 can be redrawn as encoder 400 illustrated in FIG. 4. The SPC and ACC encoders 405 and 407 may be combined to form a single encoder that is equivalent to an accumulator with irregular puncturing as shown in FIG. 3, where dashed lines are used to indicate the punctured positions. The LDPC code defined by H of (2) can be interpreted as follows:

The input vector [$x_0$, $x_1$, $x_2$, $x_3$, $x_4$, $x_5$, $x_6$] passes through repeater 401 with a repetition vector Q=[$Q_0$ $Q_1$ $Q_2$ $Q_3$ $Q_4$ $Q_5$ $Q_6$], where input bit $x_1$ is repeated $Q_i$ times. The parallel to serial (P/S) indicates the $$\sum_{i=0}^{6} Q_i$$

bits generated in parallel are converted to serial. Interleaver 403 permutes the output of repetition code before the SPC encoder 405 according to a permutation $\rho$. The SPC code outputs one bit for every $J_i$ serialized input bits ($J_i \in \{J_0 J_1 J_2 J_3 J_4 J_5\}$). The S/P indicates that $J_i$ bits are input to the SPC to obtain one bit $u_i$ where $u_i$ is a temporary variable. The output of the SPC [$u_0$, $u_1$, $u_2$, $u_3$, $u_4$, $u_5$] is accumulated by accumulator 407 successively to obtain the unknown parity bits of the codeword.

The exact parameters of the GRA-like encoder may be obtained by partitioning the H matrix into two parts, H=[$H_{GRA}$ $H_{p2}$], as shown in (6). $H_{p2}$ is the partial dual-diagonal parity portion, and $H_{GRA}$ is the remaining portion of H. Note that the columns of $H_{GRA}$ correspond to the systematic bits and one parity bit (separated by the dotted line).

$$H_{GRA} = \begin{bmatrix} 1 & 0 & 1 & 0 & 0 & 0 & | & 1 \\ 0 & 1 & 0 & 0 & 1 & 0 & | & 0 \\ 0 & 0 & 1 & 0 & 0 & 1 & | & 1 \\ 1 & 0 & 0 & 1 & 0 & 0 & | & 0 \\ 0 & 1 & 0 & 0 & 1 & 0 & | & 0 \\ 0 & 0 & 0 & 1 & 0 & 1 & | & 1 \end{bmatrix} \underbrace{\phantom{xxxxxxxxxxxx}}_{k-1} \quad (6)$$

$$H_{p2} = \begin{bmatrix} 1 & 0 & 0 & 0 & 0 \\ 1 & 1 & 0 & 0 & 0 \\ 0 & 1 & 1 & 0 & 0 \\ 0 & 0 & 1 & 1 & 0 \\ 0 & 0 & 0 & 1 & 1 \\ 0 & 0 & 0 & 0 & 1 \end{bmatrix} \underbrace{\phantom{xxxxxxxx}}_{m-1}$$

The parameters, (Q, J, $\rho$), of the GRA-like encoder are found from $H_{GRA}$ as shown below:

The Repetition factor Q is a vector with $Q_i$ equal to the number of ones in the $i^{th}$ column of $H_{GRA}$, i=0, 1, ..., k.

The SPC parameter J is a vector with $J_i$ equal to the number of ones in the $i^{th}$ row of $H_{GRA}$, i=0, 1, ..., m−1.

The interleaver length W is equal to the number of ones in $H_{GRA}$. By definition, the $i^{th}$ bit in the input of the interleaver is permuted to the p(i)$^{th}$ bit of the interleaver output sequence. Thus the interleaver ($\rho$) can be obtained as follows:

Label the ones (i.e., edges) in $H_{GRA}$ in a column-wise order starting with the left-most column as shown in the left hand side of (7). These indices sequentially number the edges after repetition, before interleaving.

Label the ones in $H_{GRA}$ in a row-wise order from the top-most row as shown on the right hand side of (7). These indices sequentially number the edges after interleaving, before being sent to the SPC.

The permutation ($\rho$) of length-W is given by reading the row-wise label in column-wise order.

For the (12,6) code of (2), the parameters are Q=[2 2 2 2 2 3], J=[3 2 3 2 2 3], and the interleaver is given by the permutation $\rho$=[0 8 3 10 1 5 9 12 4 11 6 13 2 7 14]. Note that $$\sum_{i=0}^{6} Q_i = \sum_{i=0}^{5} J_i = W = 15.$$

$$H_{GRA} = \begin{bmatrix} 1_0 & 0 & 1_4 & 0 & 0 & 0 & | & 1_{12} \\ 0 & 1_2 & 0 & 0 & 1_8 & 0 & | & 0 \\ 0 & 0 & 1_5 & 0 & 0 & 1_{10} & | & 1_{13} \\ 1_1 & 0 & 0 & 1_6 & 0 & 0 & | & 0 \\ 0 & 1_3 & 0 & 0 & 1_9 & 0 & | & 0 \\ 0 & 0 & 0 & 1_7 & 0 & 1_{11} & | & 1_{14} \end{bmatrix} \xrightarrow{\rho} \quad (7)$$

$$\begin{bmatrix} 1_0 & 0 & 1_1 & 0 & 0 & 0 & | & 1_2 \\ 0 & 1_3 & 0 & 0 & 1_4 & 0 & | & 0 \\ 0 & 0 & 1_5 & 0 & 0 & 1_6 & | & 1_7 \\ 1_8 & 0 & 0 & 1_9 & 0 & 0 & | & 0 \\ 0 & 1_{10} & 0 & 0 & 1_{11} & 0 & | & 0 \\ 0 & 0 & 0 & 1_{12} & 0 & 1_{13} & | & 1_{14} \end{bmatrix}$$

A Turbo-Like Decoder for LDPC Codes

Figure 5:
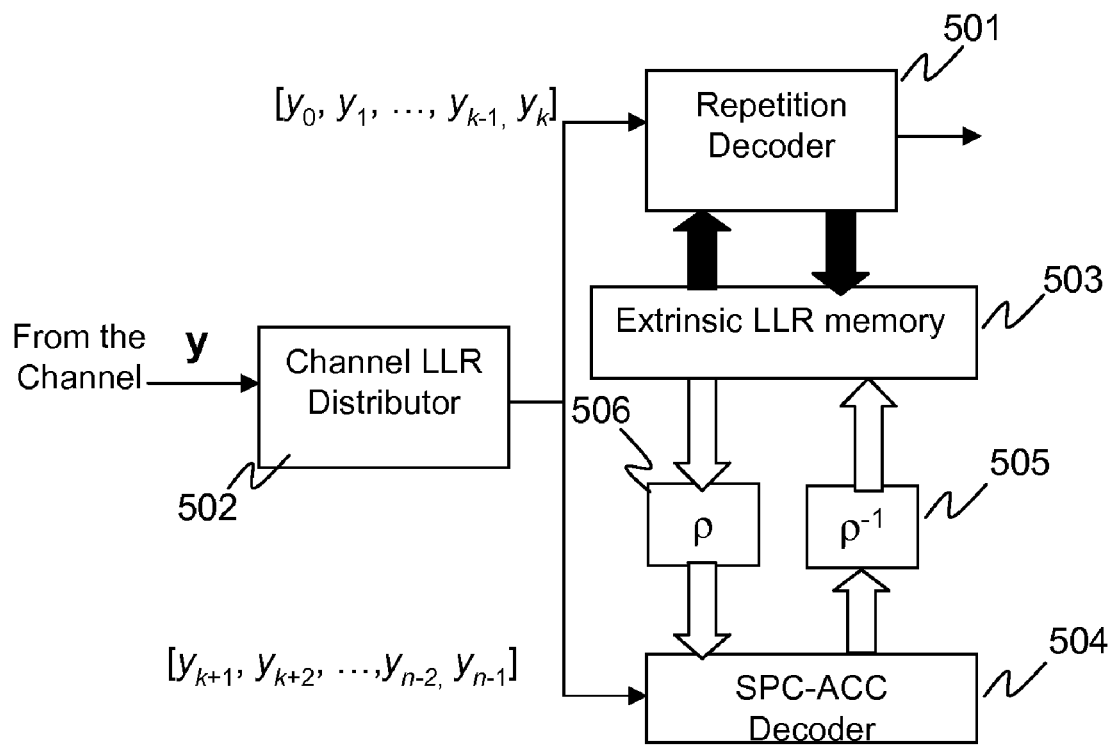
FIG. 5 is a block diagram of a turbo-like decoder.

Once the GRA encoder of LDPC codes with partial dual-diagonal portion is derived, the corresponding turbo-like decoder may be constructed. Based on FIG. 4, block diagram of the "turbo-like" decoder 500 is shown in FIG. 5.

A turbo-like decoder for LDPC codes consists of two component decoders—repetition decoder 501, and a combined SPC-ACC decoder 504. The component decoders are not convolutional decoders used in a conventional turbo decoder, e.g., with constituent codes of R=⅓ 8-state convolutional codes. Corresponding to FIG. 5, $y_{p2}$, the portion of received signal vector y corresponding to dual-diagonal parity portion $H_{p2}$, is input to SPC-ACC decoder 504. The remaining portion of y, $y_{GRA}$ which corresponds to $H_{GRA}$, is input to the repetition decoder 501. This distribution of this received signal vector is done by the channel LLR distributor 502. From the graph perspective of the H matrix shown in FIG. 1, the two decoders 501 and 504 iteratively exchange extrinsic LLR messages of the edges corresponding to the $H_{GRA}$ via (de) interleaver 505. Therefore, the extrinsic message memory 503 size is proportional to the number of 1's in $H_{GRA}$ which is also equal to W, the size of the interleaver 506. An iteration of the algorithm is described below, where the edge messages are assumed to be in LLR format.

1. Repetition decoder: The messages from the SPC-ACC decoder are de-interleaved and sent to the repetition decoder as a priori information. The repetition decoder processes the a priori messages together with $y_{GRA}$, and generates an extrinsic message for each edge of $H_{GRA}$ that are sent to the SPC-ACC decoder via the interleaver. Only additions/subtractions are needed in calculating the extrinsic messages. The repetition decoding process is equivalent to the "variable node update" (VNU) in LDPC literature, except that it only covers the variable nodes corresponding to $H_{GRA}$.

2. SPC-ACC decoder: The interleaved a priori messages from the repetition decoder and $y_{p2}$ are processed in the SPC-ACC decoder to produce an extrinsic message for each edge of $H_{GRA}$, which are passed back to the repetition decoder via the de-interleaver. The extrinsic messages may be calculated using trellis-based algorithms or a belief propagation decoder. The SPC-ACC decoding processing is similar to the "check node update" (CNU) in LDPC literature, except that it covers all the check equations linked by an ACC After a certain number of iterations, a hard (or soft) decision estimate of the information vector ŝ based on the a posteriori LLRs is calculated by the repetition decoder. If a stopping rule is required, then the TLD can be trivially modified to yield hard decisions of all the code bits to test if all parity-check equations are satisfied.

Figure 6:
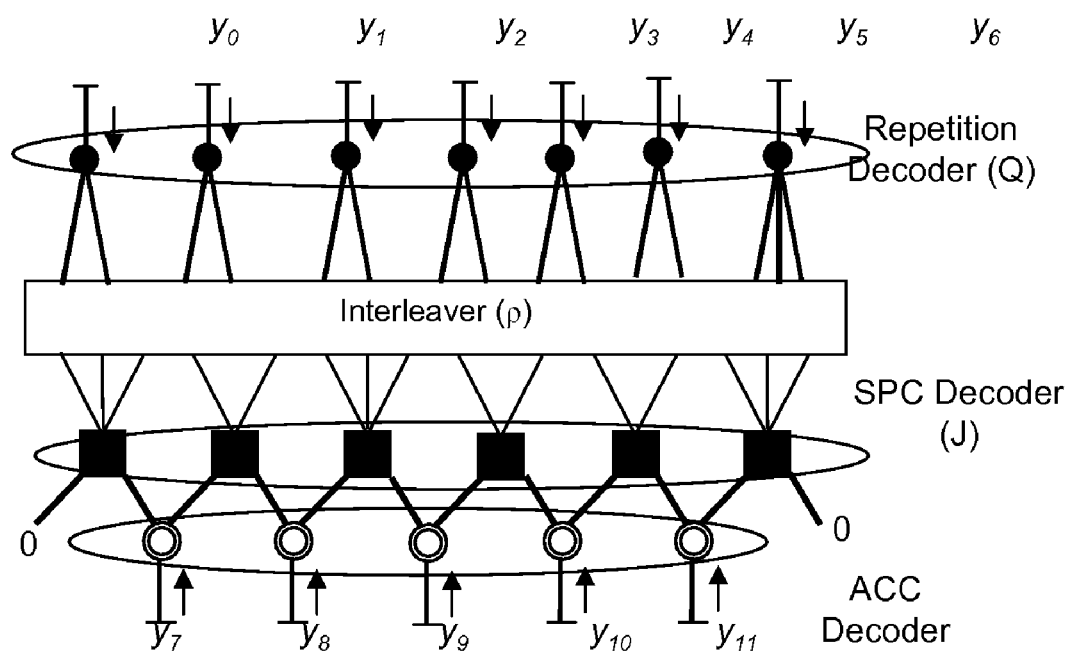
FIG. 6 is a graph-model of a turbo-like decoder.

In the TLD, several parity-check equations are linked to each other directly through the ACC. This is illustrated in FIG. 6 where turbo-like decoder 600 of structured LDPC codes. Solid circles indicated the repetition decoder similar to the variable node update (VNU) of traditional LDPC decoders. Filled squares represent the SPC decoder with an update rule identical to the check node update of traditional LDPC decoders. Unfilled circles represent ACC decoders with an update rule similar to the VNU. The 0's on the left and right indicate that the ACC starts and ends in all-zero state. This allows the check equations to send messages to each other directly during the SPC-ACC decoding. From a Tanner graph perspective, the TLD algorithm only updates the edges connected to the systematic bits and one parity bit, and does not update all the edges in the Tanner graph. The TLD may therefore be used in applications with stringent memory requirements.

Structured LDPC Codes

Many LDPC codes are structured codes, designed to enable efficient encoding/decoding from the perspective of traditional LDPC decoding algorithms such as SBP and LBP. A structured or vectorized LDPC code design starts with a small $m_b \times n_b$ base matrix $H_b$, makes z copies of $H_b$, and interconnects the z copies to form a large M×N H matrix, where M=$m_b \times z$, N=$n_b \times z$. Using the matrix representation, to build an H from $H_b$ each 1 in $H_b$ is replaced by a z×z permutation matrix, and each 0 in $H_b$ is replaced by a z×z all-zero matrix. It has been shown that simple circular right shift of the columns of a z×z identity matrix (P) can be used as a permutation matrix. Each H matrix can be uniquely represented by a $m_b \times n_b$ model matrix $H_{bm}$, which is obtained by replacing each 0 in $H_b$ by −1 to denote a z×z all-zero matrix, and replacing each $h_{i,j}$=1 in $H_b$ by a circular shift size p(i,j). For example, the matrix in (2) may be used as a base matrix $H_b$ to build a model matrix $H_{bm}$.

$$H_{bm} = \left. \begin{bmatrix} 1 & -1 & 0 & -1 & -1 & -1 & | & 0 & | & 0 & -1 & -1 & -1 & -1 \\ -1 & 2 & -1 & -1 & 0 & -1 & | & -1 & | & 0 & 0 & -1 & -1 & -1 \\ -1 & -1 & 1 & -1 & -1 & 2 & | & 2 & | & -1 & 0 & 0 & -1 & -1 \\ 2 & -1 & -1 & 1 & -1 & -1 & | & -1 & | & -1 & -1 & 0 & 0 & -1 \\ -1 & 1 & -1 & -1 & 0 & -1 & | & -1 & | & -1 & -1 & -1 & 0 & 0 \\ -1 & -1 & -1 & 0 & -1 & 1 & | & 0 & | & -1 & -1 & -1 & -1 & 0 \end{bmatrix} \right\} m_b \quad (8)$$

$$\underbrace{\phantom{xxxxxxxxxxxxxxxxxxxxxxxxxxxxxxxxxxx}}_{n_b}$$

When z=3, $H_{bm}$ is converted to a $(m_b \times z) \times (n_b \times z)$ binary matrix H by replacing each −1 with a 3×3 all-zero matrix and each i with $P_i$, i=0, 1, 2, where $$P_0 = \begin{bmatrix} 1 & 0 & 0 \\ 0 & 1 & 0 \\ 0 & 0 & 1 \end{bmatrix}, P_1 = \begin{bmatrix} 0 & 1 & 0 \\ 0 & 0 & 1 \\ 1 & 0 & 0 \end{bmatrix}, P_2 = \begin{bmatrix} 0 & 0 & 1 \\ 1 & 0 & 0 \\ 0 & 1 & 0 \end{bmatrix}.$$

The resulting H-matrix has a codeword size N=36, and information vector size K=18.

It was shown earlier that base matrix $H_b$ of (2) can be encoded and decoded using GRA-like structure. If such a base matrix is used to create an H matrix by expansion (e.g., as in (8)), then the resulting H matrix can also be encoded using a bank of GRA-like encoders. The encoder of the expanded H matrix consists of z interconnected copies of the GRA-like encoder of the base matrix $H_b$, where z is the expansion factor.

Let a vectorized LDPC code be constructed with a model matrix $H_{bm}$ and an expansion factor z. The corresponding encoder takes K=k z information bits as input, and outputs N=n z codeword bits according to the (N−K)×N expanded binary H matrix. Encoding and decoding of such codes may be performed in groups of z bits each, and hence such LDPC codes were referred to as vectorized or structured LDPC codes. Most of the properties of the vectorized LDPC codes, for example, encoding/decoding operations, may be easily expanded from those of the base matrix $H_b$. For efficient encoding, the model matrix $H_{bm}$ must have an odd weight in the non-dual diagonal parity column, and within that column, all shift sizes except one occur even number of times. For example, in (8), the k+1=$7^{th}$ column has shift sizes {0, 2, 0}. The following text describes how a GRA-like encoder of structured LDPC codes may be derived from that of the base matrix $H_b$.

Let S=[$S_0$, $S_1$, $S_2$ ... $S_{k-1}$] and X=[$X_0$ $X_1$ ... $X_{n-1}$] represent the information vector and the codeword block, respectively, where each element is a z-bit vector (i.e., size z×1). The group-wise encoding may be done in a three-step process as described next.

Step 1. Fill the systematic portion of codeword with a direct copy of the information bits [$S_0$, $S_1$, $S_2$, $S_3$, ·$S_{k-1}$], i.e., $X_0=S_0, X_1=S_1, X_2=S_2, \ldots, X_{k-1}=S_{k-1}$.

Step 2. Compute the parity block ($X_k$) related to the non-dual-diagonal parity portion (i.e., by solving the corresponding parity-check equations, e.g., by using the GRA-like encoder hardware itself).

Step 3. Compute the parity blocks related to the partial dual-diagonal parity portion ($X_{k+1}, \ldots X_{n-1}$) using a vectorized GRA-like structure and the results of Step 1 and Step 2 using simple vectorized accumulation technique.

Figure 7:
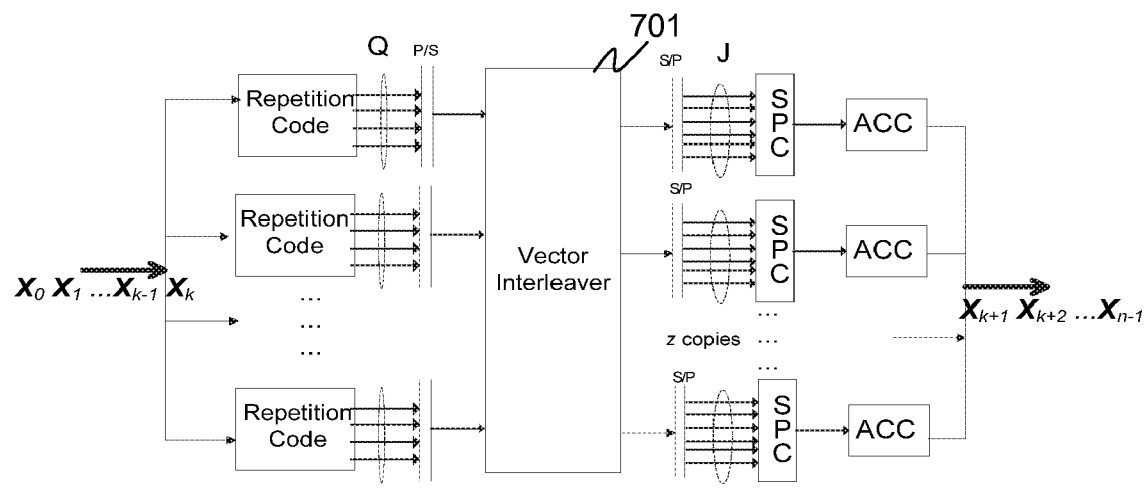
FIG. 7 is a block diagram of a vectorized GRA-like encoder.
Figure 8:
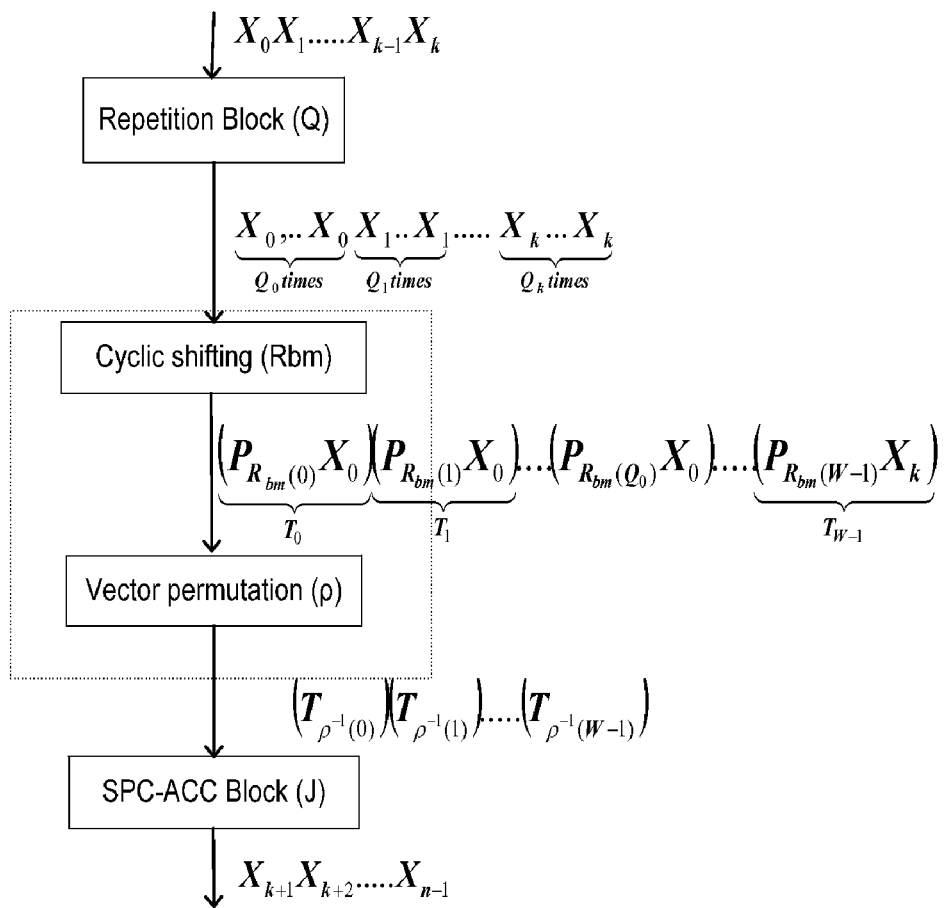
FIG. 8 is a flow chart of a vectorized GRA-like encoder.

As illustrated in FIG. 7, the vectorized GRA-like encoder consists of z copies of GRA-like encoder of the base matrix $H_b$ interconnected by an interleaver. In the figure, it is assumed that the each group of z bits is represented using a column vector. The advantages of using a vectorized LDPC are evident from FIG. 7, i.e., the repetition factors Q, and the SPC parameters J of all the z copies are identical to that of the base matrix. The z copies are interconnected through vector interleaver 701 that is obtained from the base matrix interleaver (ρ), and the non-negative entries of the model matrix $H_{bm}$. A flow chart for encoding in a vectorized format is shown in FIG. 8 where each element in the input and output is a z×1 vector (or a column vector), and $P_i$ are cyclic shifted identity matrices as described earlier. From the figure, it is observed that two stages of permutation (shown with the dotted box) are required between the repetition block and the SPC-ACC block.

The vector interleaver of a structured LDPC code has two stages of permutations—

A set $R_{bm}$ that stores a set of shift sizes from the model matrix $H_{bm}$ for performing cyclic rotation within each message vector.

A Permuter (ρ) that is obtained from the base matrix to permute the message vectors (i.e., vector reordering).

The GRA parameters of the vectorized H matrix may be described in terms of the base matrix parameters as follows:

z copies of repetition encoder and z copies SPC-ACC encoder of $H_b$.

Repetition factors $Q_b$ and SPC parameters $J_b$ for all z copies are defined by base matrix $H_b$.

A interleaver that has i) a permutation (ρ) that is defined by the base matrix and ii) a set of shift sizes ($R_{bm}$) which depends on the model matrix.

For the (36, 18) code of (8), the GRA parameters are identical to those of the base matrix $H_b$ of (2): $Q_b$=[2 2 2 2 2 3], $J_b$=[3 2 3 2 2 3], the permutation is ρ=[0 8 3 10 1 5 9 12 4 11 6 13 2 7 14].

An additional parameter describing vectorized GRA-like encoder are the shift values $R_{bm}$, which can be obtained from the model matrix of (8) by reading the shift sizes in a column-wise order starting from the left hand side of the $H_{bm,GRA}$ shown in (9). This leads to a set of shift sizes given by $R_{bm}$=[1 2 2 1 0 1 1 0 0 0 2 1 0 2 0].

$$H_{bm,GRA} = \begin{bmatrix} 1_0 & -1 & 0_4 & -1 & -1 & -1 & | & 0_{12} \\ -1 & 2_2 & -1 & -1 & 0_8 & -1 & | & -1 \\ -1 & -1 & 1_5 & -1 & -1 & 2_{10} & | & 2_{13} \\ 2_1 & -1 & -1 & 1_6 & -1 & -1 & | & -1 \\ -1 & 1_3 & -1 & -1 & 0_9 & -1 & | & -1 \\ -1 & -1 & -1 & 0_7 & -1 & 1_{11} & | & 0_{14} \end{bmatrix} \quad (9)$$

Figure 9:
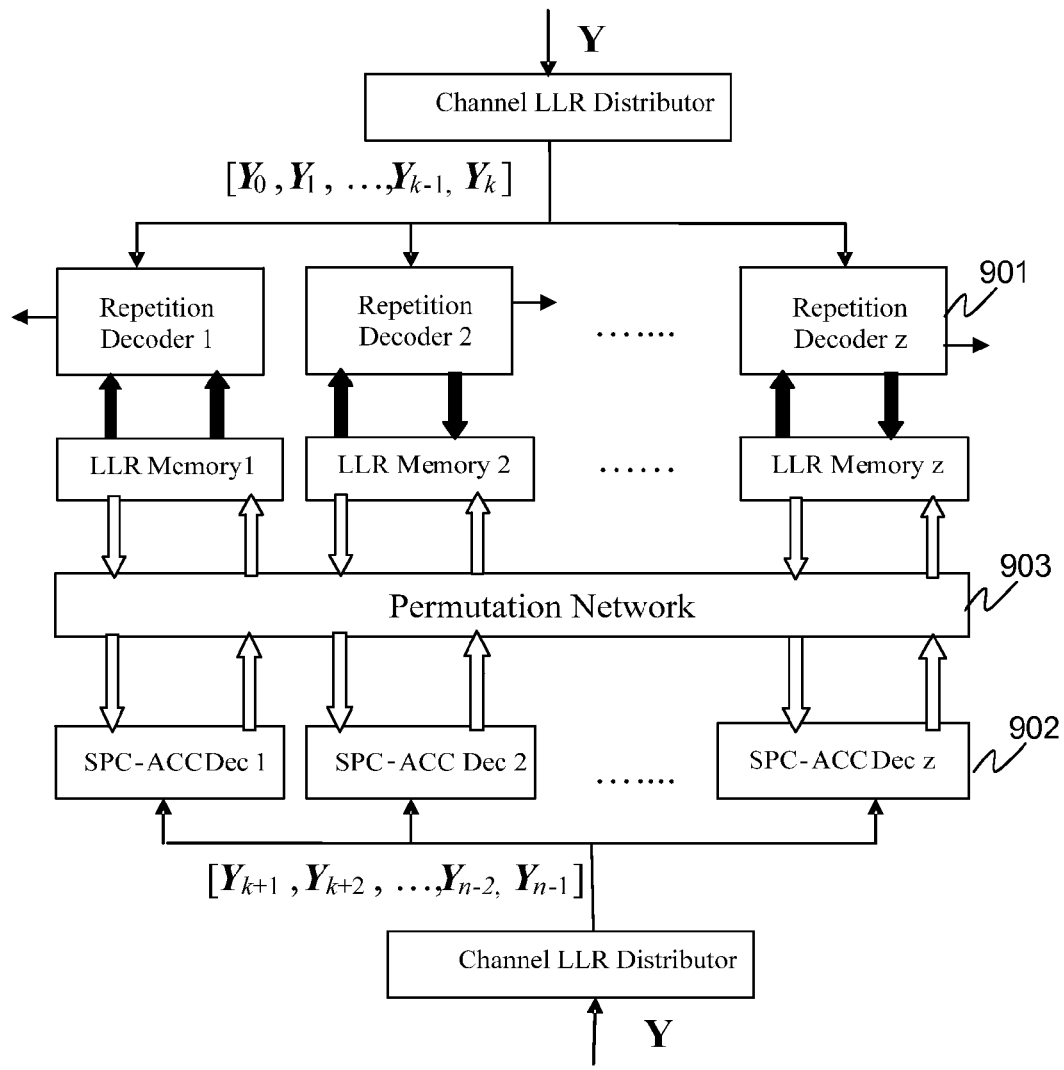
FIG. 9 is a block diagram of a parallelized turbo-like decoder.

The decoding of the structured H matrix can also be performed in a vectorized (or parallelized) manner, analogous to the vectorized encoding. A block diagram of a parallelized turbo-like decoder is shown in FIG. 9. In FIG. 9, channel LLR distributor distributes the channel LLRs to enable TLD. Block lines indicate memory operations (read and write) during the iterative decoding. Filled block lines indicate the repetition decoding and unfilled block lines indicate SPC-ACC decoding. Decoder 900 consists of z repetition decoders 901 and z SPC-ACC decoders 902 that are interconnected through interleaver 903 (a.k.a., a permutation network). As in the vectorized encoder, the interleaver has two stages: cyclic shift within each vector and permutation of the vectors. As described in the previous section, an LLR distributor distributes the received LLRs suitably i.e., LLRs corresponding to weight-2 parity columns (i.e., $H_{bm,p2}$) are input to the SPC-ACC decoders and the remaining LLRs are distributed to the repetition decoders.

Figure 10:
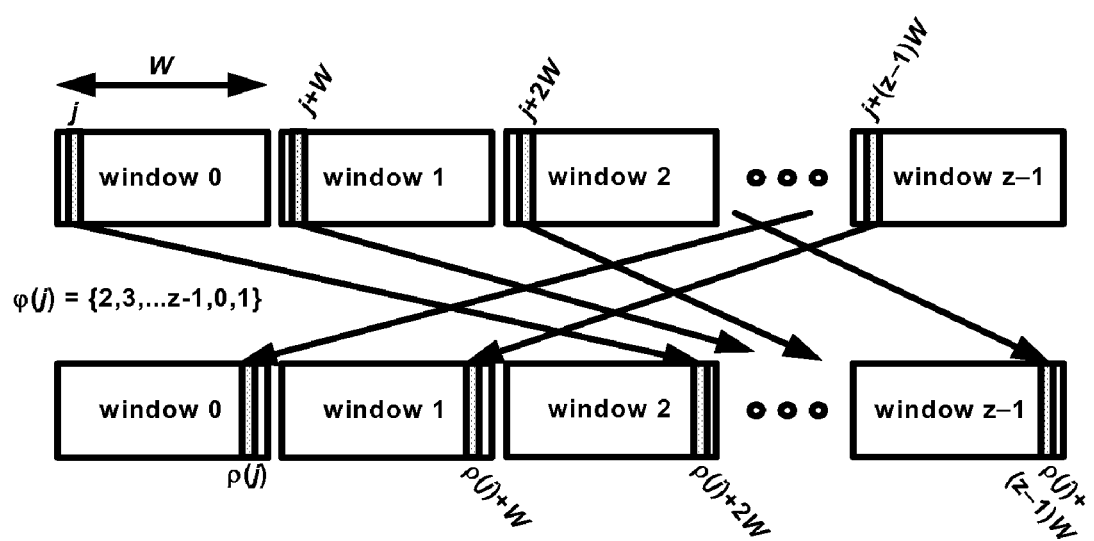
FIG. 10 is a block diagram of an interleaver.

FIG. 10 is a block diagram of interleaver 1000. In FIG. 10, each vector $Y_i$, i=0 ... n−1, contains z LLR values, analogous to the vectorized encoding procedure described earlier in this section. In one embodiment, high speed turbo-like decoding is achieved by using several processors operating in parallel. The LLRs are stored in multiple memories to allow more than one concurrent read/write operations. The extrinsic LLR messages generated by the repetition decoder and the SPC-ACC decoders are exchanged through interleaver 1000 and a corresponding de-interleaver that are contention-free. The interleaver 1000 may be equivalently represented as a contention-free (CF) inter-window shuffle (IWS) interleaver. CF interleavers ensure that the concurrent read/write operations for z windows do not result in any memory access contentions.

An interleaver π(i), 0≦i≦K, is said to be contention-free for a window size W if and only if satisfies the following constraint for both ψ=π (interleaver) and ψ=$π^{-1}$ (de-interleaver).

$$\left\lfloor \frac{\psi(j+tW)}{W} \right\rfloor \neq \left\lfloor \frac{\psi(j+vW)}{W} \right\rfloor \quad (10)$$

where 0≦j≦W, 0≦t; v<M(=K/W), and t≠v. The terms in (10) are essentially the memory bank indices that are concurrently accessed by the M processors and if these memory bank addresses are all unique during each read and write operations, there are no contentions in memory access.

Interleaver 1000 of a structured LDPC code may be interpreted as a CF interleaver by making the following observation about the two stages of permutations—

The cyclic shift of individual vectors as specified by $R_{bm}$ is an the inter-window shuffle pattern.

The permutation among the vectors as specified by ρ is equivalent to the intra-window permutation.

In general, CF interleaver 1000 can be described as $$\pi(i)=\rho(i \bmod W)+W\phi_{\lfloor i/W \rfloor}(i \bmod W) \quad (11)$$

where vector ρ defines the intra-window shuffling, φ(i) defines inter-window shuffling for the i-th slot of the window. For the vectorized TLD decoder, the window size is given by W which is the length of the base matrix interleaver ρ, and φ(i) is the cyclic shifted vector with shift size $R_{bm}(i)$. As an example, if $R_{bm}(i)$=2, φ(i)=(2, 3, ..., z, 0, 1). Mathematically, the inter-window shuffle pattern can be expressed as follows.

$$\varphi_{\lfloor i/W \rfloor}(i \bmod W) = \left(R_{bm}(i \bmod W) + \left\lfloor \frac{i}{W} \right\rfloor\right) \bmod z \quad (12)$$

decoding form a trellis, and decoding algorithms are applied to each trellis to produce extrinsic LLRs. In contrast, for TLD of LDPC, each window before interleaving does not form a trellis. Each window contains k+1 repetition codes, and the extrinsic LLRs are produced by applying repetition decoding on every $Q_i$ edge LLRs, i=0, 1, ..., k.

In addition, for turbo codes, both before and after interleaving, all the windows are inherently linked together. Each window (length W) is a section of a length zW trellis, and the LLRs on either end of the window can utilize the LLRs of the adjacent windows. The length zW can be equivalently divided into windows of other sizes (although the CF property may not be maintained). For TLD of LDPC, both before and after interleaving, the z windows are independent of each other and can be decoded simultaneously. Inherently, each window after interleaving is a complete 2-state trellis.

An example of structured H-matrix:

The IEEE802.16e LDPC codes are structured LDPC codes whose H matrices are derived by expanding the corresponding model matrix $H_{bm}$ with an expansion factor z. For instance, the following is a base model matrix for Rate-½ LDPC code for the expansion factor z=96.

```
-1  94  73  -1  -1  -1  -1  -1  55  83  -1  -1   7   0  -1  -1  -1  -1  -1  -1  -1  -1  -1  -1
-1  27  -1  -1  -1  22  79   9  -1  -1  -1  12  -1   0   0  -1  -1  -1  -1  -1  -1  -1  -1  -1
-1  -1  -1  24  22  81  -1  33  -1  -1  -1   0  -1  -1   0   0  -1  -1  -1  -1  -1  -1  -1  -1
61  -1  47  -1  -1  -1  -1  -1  65  25  -1  -1  -1  -1   0   0  -1  -1  -1  -1  -1  -1  -1  -1
-1  -1  39  -1  -1  -1  84  -1  -1  41  72  -1  -1  -1  -1   0   0  -1  -1  -1  -1  -1  -1  -1
-1  -1  -1  -1  46  40  -1  82  -1  -1  -1  79   0  -1  -1  -1   0   0  -1  -1  -1  -1  -1  -1
-1  -1  95  53  -1  -1  -1  -1  14  18  -1  -1  -1  -1  -1  -1   0   0  -1  -1  -1  -1  -1  -1
-1  11  73  -1  -1   2  -1  -1  47  -1  -1  -1  -1  -1  -1  -1  -1   0   0  -1  -1  -1  -1  -1
12  -1  -1  -1  83  24  -1  43  -1  -1  -1  51  -1  -1  -1  -1  -1  -1   0   0  -1  -1  -1  -1
-1  -1  -1  -1  -1  94  -1  59  -1  -1  70  72  -1  -1  -1  -1  -1  -1  -1   0   0  -1  -1  -1
-1  -1   7  65  -1  -1  -1  -1  39  49  -1  -1  -1  -1  -1  -1  -1  -1  -1  -1   0   0  -1  -1
43  -1  -1  -1  -1  66  -1  41  -1  -1  -1  26   7  -1  -1  -1  -1  -1  -1  -1  -1  -1   0   0
```

The interleaver in IWS fashion is depicted in FIG. 10. In summary, the cyclic shift of each individual message vector is an inter-window shuffling with a shuffle pattern $$\varphi_{\lfloor i/W \rfloor}(i \bmod W) = \left(R_{bm}(i \bmod W) + \left\lfloor \frac{i}{W} \right\rfloor\right) \bmod z,$$

where the window size W is equal to the length of ρ (and the length of $R_{bm}$), and the interleaver generates an output address $\pi(i)=\rho(i \bmod W)+W\phi_{\lfloor i/W \rfloor}(i \bmod W)$ for an input i.

Note that before interleaving, the i-th window, i=0, 1, ..., z−1, is composed of $[R_{0,0}(i), R_{1,0}(i), \ldots, R_{Q_0-1,0}(i), R_{1,1}(i), \ldots, R_{Q_1-1,1}(i), \ldots, R_{0,K}(i), R_{1,K}(i), \ldots, R_{Q_K-1,K}(i)]$, where $R_{a,b}(i)$ is the i-th element of vector edge LLR $R_{a,b}$, which corresponds to the a-th non-negative element in b-th column of $H_{bm}$. Compare the IWS interleaver of FIG. 10 for turbo coding and the TLD decoding of LDPC, there are several differences: Before interleaving, each window in turbo The parameters of the GRA-like encoder for this matrix may be obtained by following the procedure described earlier in the section and the parameters are as follows.

$Q_b$ = [3 3 6 3 3 6 3 6 3 6 3 6 3]

$J_b$ = [5 5 5 4 4 5 4 4 5 4 4 5]

$$\sum_{i=0}^{12} Q_i = \sum_{i=0}^{11} J_i = W = 54$$

ρ=[15 36 49 0 5 32 1 16 19 28 33 45 10 29 46 11 23 37 6 12 24 38 41 50 7 20 34 8 13 25 39 42 51 2 17 47 3 18 21 30 35 48 22 31 43 9 14 26 40 44 52 4 27 53]

$R_{bm}$=[61 12 43 94 27 11 73 47 39 95 73 7 24 53 65 22 46 83 22 81 40 24 94 66 79 84 2 9 33 82 43 59 41 55 65 39 83 25 41 14 47 49 72 18 70 12 0 79 51 72 26 7 0 7]

The inter-window shuffle (IWS) interleaver is given by the following permutation where $0 \leq i < 5184 (=54 \times 96)$ $$\pi(i) = \rho(i \bmod 54) + 54\phi_{\lfloor i/54 \rfloor}(i \bmod 54), \quad (13)$$

and the inter-window shuffle pattern $\phi$ is given as follows.

$$\varphi_{\lfloor i/54 \rfloor}(i \bmod 54) = \left(R_{bm}(i \bmod 54) + \left\lfloor \frac{i}{54} \right\rfloor\right) \bmod 96, \quad (14)$$

Note that shift values $R_{bm}$ for expansion factors z<96 may be obtained using scaling and modulo techniques, as described in IEEE 802.16e specification. The corresponding IWS interleavers may also be obtained by simply changing the shift sizes $R_{bm}$ in (14) and expansion factor z.

The GRA-like encoder (and the corresponding turbo-like decoder with a CF interleaver) may be derived for any structured LDPC codes with a partial dual-diagonal parity portion in the base matrix, including IEEE 802.16e LDPC codes, and LDPC codes considered for IEEE 802.11n, etc.

As another example, the following is a base model matrix for Rate-½ LDPC code for the expansion factor z=54 used in the draft 802.11n standard.

```
40 -1 -1 -1 22 -1 49 23 43 -1 -1 -1  1  0 -1 -1 -1 -1 -1 -1 -1 -1 -1 -1
50  1 -1 -1 48 35 -1 -1 13 -1 30 -1 -1  0  0 -1 -1 -1 -1 -1 -1 -1 -1 -1
39 50 -1 -1  4 -1  2 -1 -1 -1 -1 49 -1 -1  0  0 -1 -1 -1 -1 -1 -1 -1 -1
33 -1 -1 38 37 -1 -1  4  1 -1 -1 -1 -1 -1  0  0 -1 -1 -1 -1 -1 -1 -1 -1
45 -1 -1 -1  0 22 -1 -1 20 42 -1 -1 -1 -1 -1  0  0 -1 -1 -1 -1 -1 -1 -1
51 -1 -1 48 35 -1 -1 -1 44 -1 18 -1 -1 -1 -1 -1  0  0 -1 -1 -1 -1 -1 -1
47 11 -1 -1 -1 17 -1 -1 51 -1 -1 -1  0 -1 -1 -1 -1  0  0 -1 -1 -1 -1 -1
 5 -1 25 -1  6 -1 45 -1 13 40 -1 -1 -1 -1 -1 -1 -1 -1  0  0 -1 -1 -1 -1
33 -1 -1 34 24 -1 -1 -1 23 -1 -1 46 -1 -1 -1 -1 -1 -1 -1  0  0 -1 -1 -1
 1 -1 27 -1  1 -1 -1 -1 38 -1 44 -1 -1 -1 -1 -1 -1 -1 -1 -1  0  0 -1 -1
-1 18 -1 -1 23 -1 -1  8  0 35 -1 -1 -1 -1 -1 -1 -1 -1 -1 -1 -1  0  0 -1
49 -1 17 -1 30 -1 -1 -1 34 -1 -1 19  1 -1 -1 -1 -1 -1 -1 -1 -1 -1 -1  0
```

The parameters of the GRA-like encoder for this matrix may be obtained by following the procedure described earlier in the section and the parameters are as follows.

$Q_b = [11\ 4\ 3\ 3\ 11\ 3\ 3\ 3\ 11\ 3\ 3\ 3\ 3]$ $J_b = [6\ 6\ 5\ 5\ 5\ 5\ 5\ 6\ 5\ 5\ 5\ 6]$ $$\sum_{i=0}^{12} Q_i = \sum_{i=0}^{11} J_i = W = 64$$

p=[0 6 12 17 22 27 32 37 43 48 58 7 13 33 53 38 49 59 18 28 44 1 8 14 19 23 29 39 45 50 54 60 9 24 34 2 15 40 3 20 55 4 10 21 25 30 35 41 46 51 56 61 26 42 57 11 31 52 16 47 62 5 36 63]

$R_{bm}$=[40 50 39 33 45 51 47 5 33 1 49 18 25 27 17 38 48 34 22 48 4 37 0 35 6 24 1 23 30 35 22 17 49 2 45 23 4 8 43 13 1 20 44 51 13 23 38 0 34 42 40 35 30 18 44 49 46 19 1 0 1]

The inter-window shuffle (IWS) interleaver is given by the following permutation where $0 \leq i < 3456 (=54 \times 64)$ $$\pi(i) = \rho(i \bmod 64) + 64\phi_{\lfloor i/64 \rfloor}(i \bmod 64), \quad (15)$$

where the inter-window shuffle pattern $\phi$ is given as follows.

$$\varphi_{\lfloor i/64 \rfloor}(i \bmod 64) = \left(R_{bm}(i \bmod 64) + \left\lfloor \frac{i}{64} \right\rfloor\right) \bmod 54, \quad (16)$$

Figure 11:
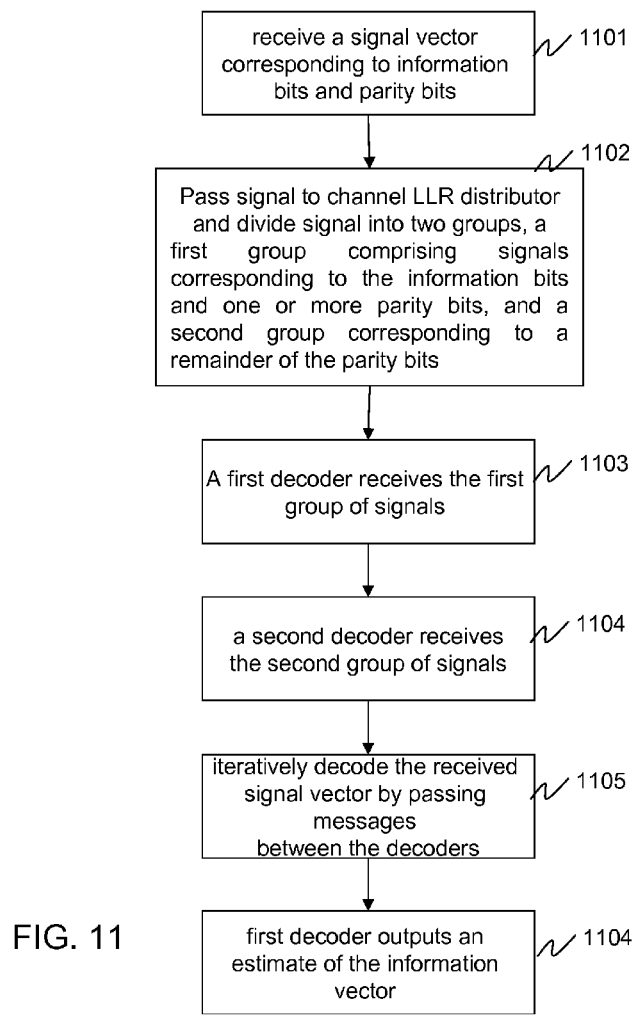
FIG. 11 is a flow chart showing operation of the decoder of FIG. 9.

FIG. 11 is a flow chart showing operation of the decoder of FIG. 9. During operation receiver circuitry (not shown in FIG. 9) receives a signal vector corresponding to information bits and parity bits (step 1101). As discussed, the signal vector corresponds to a codeword of a structured LDPC code using a structured parity-check matrix H with expansion factor z, a base matrix $H_b$, and a model matrix $H_{bm}$.

At step 1102 this signal is passed to channel LLR distributor, where it is divided into two groups, a first group comprising signals corresponding to the information bits and one or more parity bits, and a second group corresponding to a remainder of the parity bits. A first decoder receives the first group of signals (step 1103) and a second decoder receives the second group of signals (step 1104). As discussed above, the first decoder comprises a repetition decoder 901 and the second decoder comprises a parity check accumulator decoder 902. Also, when a plurality of repetition decoders and a plurality of SPC accumulator decoders are being utilized, the plurality of decoders receives copies of the first group and the second group of signals. Additionally, each of the repetition decoders has a same repetition factor $Q_b$ obtained from the base matrix $H_b$, and the output messages of the repetition decoders are sent to the interleaver. Each of the SPC-Accumulator decoders has a same SPC parameter $J_b$ obtained from the base matrix $H_b$, and the output messages of the SPC-Accumulator decoders are sent to the de-interleaver.

Continuing, at step 1105 the first and the second decoders iteratively decode the received signal vector by passing messages between the decoders, where the decoders are separated by an interleaver and a de-interleaver (permutation network 903), and wherein the first decoder outputs an estimate of the information vector (step 1106).

While the invention has been particularly shown and described with reference to a particular embodiment, it will be understood by those skilled in the art that various changes in form and details may be made therein without departing from the spirit and scope of the invention. For example, although the interleaver and the de-interleaver are described as individual components, they can be realized an address generator that allows reading messages from and writing messages to proper addresses. In another example, the decoder has been described with flooding schedule where z SPC-ACC decoders are instantiated and operated on simultaneously. However, one may instantiate one SPC-ACC decoder and updates the z SPC-ACC codes serially (i.e., layered decoding).

In another example, the description above has assumed that soft information in the form of LLR is given to the decoder. However, the information given to the encoder can be in other format, such as binary estimates of the codeword, and the message passed between the repetition and SPC-ACC decoders can be binary values as well (i.e., hard-decision decoding).

In another example, the description above has assumed that only one parity bit is distributed to the repetition decoder (one parity vector in the case of structured LDPC codes). However, more parity bits (parity bit vectors in the case of structured LDPC codes) may be distributed to the repetition decoder. This may have to be done if the matrix H ($H_b$ if structured LDPC) contains a partial dual-diagonal parity section that is smaller than (m−1) ($m_b$−1 if structured LDPC) columns. It is intended that such changes come within the scope of the following claims.

The invention claimed is:

1. A method for estimating an information vector containing information bits at a receiver, the method comprising the steps of:
   receiving a signal vector corresponding to information bits and parity bits;
   separating the received signal vector into two groups, a first group comprising signals corresponding to the information bits and one or more parity bits, a second group corresponding to a remainder of the parity bits;
   passing the first group to a first decoder;
   passing the second group to a second decoder;
   iteratively decoding by passing messages between the decoders, where the decoders are separated by an interleaver and a de-interleaver; and
   producing an estimate of the information vector from the output of the first decoder.

2. The method of claim 1 wherein the first decoder is a repetition decoder.

3. The method of claim 1 wherein the second decoder is a SPC-Accumulator decoder.

4. The method of claim 1 wherein the interleaver and the de-interleaver are contention-free.

5. The method of claim 1 wherein the step of receiving a signal vector corresponding to information bits and parity bits comprises the step of receiving a signal vector corresponding to a codeword of a structured LDPC code using a structured parity-check matrix H with an expansion factor z, a base matrix $H_b$, and a model matrix $H_{bm}$.

6. The method of claim 5 wherein the received signal vector is passed to a decoder comprising one or more copies of repetition decoders, an interleaver, a de-interleaver corresponding to the interleaver, and one or more copies of SPC-Accumulator decoders, where
   each repetition decoder has a same repetition factor $Q_b$ obtained from the base matrix $H_b$, and the output messages of the repetition decoders are sent to the interleaver;
   each SPC-Accumulator decoder has a same SPC parameter $J_b$ obtained from the base matrix $H_b$, and the output messages of the SPC-Accumulator decoders are sent to the de-interleaver;

7. The method of claim 5 wherein the interleaver comprises
   a set $R_{bm}$ that stores a set of shift sizes from the model matrix $H_{bm}$ for performing cyclic rotation within each message vector, and
   a Permuter (ρ) that is obtained from the base matrix $H_b$ to permute the message vectors.

8. The method of claim 7 wherein
   the cyclic shift of each individual message vector is an inter-window shuffling with a shuffle pattern $$\varphi_{\lfloor i/W \rfloor}(i \bmod W) = \left(R_{bm}(i \bmod W) + \left\lfloor \frac{i}{W} \right\rfloor\right) \bmod z,$$

where the window size W is equal to the length of ρ, and
   the interleaver generates an output address π(i)=ρ(i mod W)+W$\varphi_{\lfloor i/W \rfloor}$(i mod W) for an input i.

9. The method of claim 5 wherein each SPC-Accumulator decoder corresponds to an SPC-Accumulator that accumulates to zero.

10. The method of claim 5 wherein z=96 and $H_{bm}$=

| −1 | 94 | 73 | −1 | −1 | −1 | −1 | −1 | 55 | 83 | −1 | −1 | 7  | 0  | −1 | −1 | −1 | −1 | −1 | −1 | −1 | −1 | −1 | −1 |
| −1 | 27 | −1 | −1 | −1 | 22 | 79 | 9  | −1 | −1 | −1 | 12 | −1 | 0  | 0  | −1 | −1 | −1 | −1 | −1 | −1 | −1 | −1 | −1 |
| −1 | −1 | −1 | 24 | 22 | 81 | −1 | 33 | −1 | −1 | −1 | 0  | −1 | −1 | 0  | 0  | −1 | −1 | −1 | −1 | −1 | −1 | −1 | −1 |
| 61 | −1 | 47 | −1 | −1 | −1 | −1 | −1 | 65 | 25 | −1 | −1 | −1 | −1 | 0  | 0  | −1 | −1 | −1 | −1 | −1 | −1 | −1 | −1 |
| −1 | −1 | 39 | −1 | −1 | −1 | 84 | −1 | −1 | 41 | 72 | −1 | −1 | −1 | −1 | 0  | 0  | −1 | −1 | −1 | −1 | −1 | −1 | −1 |
| −1 | −1 | −1 | −1 | 46 | 40 | −1 | 82 | −1 | −1 | 79 | 0  | −1 | −1 | −1 | −1 | 0  | 0  | −1 | −1 | −1 | −1 | −1 | −1 |
| −1 | −1 | 95 | 53 | −1 | −1 | −1 | −1 | −1 | 14 | 18 | −1 | −1 | −1 | −1 | −1 | −1 | 0  | 0  | −1 | −1 | −1 | −1 | −1 |
| −1 | 11 | 73 | −1 | −1 | −1 | 2  | −1 | −1 | 47 | −1 | −1 | −1 | −1 | −1 | −1 | −1 | −1 | 0  | 0  | −1 | −1 | −1 | −1 |
| 12 | −1 | −1 | −1 | 83 | 24 | −1 | 43 | −1 | −1 | −1 | 51 | −1 | −1 | −1 | −1 | −1 | −1 | −1 | 0  | 0  | −1 | −1 | −1 |
| −1 | −1 | −1 | −1 | −1 | 94 | −1 | 59 | −1 | −1 | 70 | 72 | −1 | −1 | −1 | −1 | −1 | −1 | −1 | −1 | −1 | 0  | 0  | −1 |

-continued

```
-1 -1  7 65 -1 -1 -1 -1 39 49 -1 -1 -1 -1 -1 -1 -1 -1 -1 -1 -1  0  0
43 -1 -1 -1 -1 66 -1 41 -1 -1 -1 26  7 -1 -1 -1 -1 -1 -1 -1 -1 -1  0
``` and parameters
$Q_b$=[3 3 6 3 3 6 3 6 3 6 3 6 3];
$J_b$=[5 5 5 4 4 5 4 4 5 4 4 5];
ρ=[15 36 49 0 5 32 1 16 19 28 33 45 10 29 46 11 23 37 6 12 24 38 41 50 7 20 34 8 13 25 39 42 51 2 17 47 3 18 21 30 35 48 22 31 43 9 14 26 40 44 52 4 27 53];
$R_{bm}$=[61 12 43 94 27 11 73 47 39 95 73 7 24 53 65 22 46 83 22 81 40 24 94 66 79 842 9 33 82 43 59 41 55 65 39 83 25 41 14 47 49 72 18 70 12 0 79 51 72 26 7 0 7];

The inter-window shuffle interleaver is given by the permutation π(i)=ρ(i mod 54)+54φ$_{\lfloor i/54 \rfloor}$(i mod 54), where 0≦i<5184(=54×96), and the inter-window shuffle pattern φ is $$\varphi_{\lfloor i/54 \rfloor}(i\bmod 54) = \left(R_{bm}(i\bmod 54) + \left\lfloor \frac{i}{54} \right\rfloor\right)\bmod 96.$$

11. An apparatus for estimating an information vector containing information bits at a receiver, the apparatus comprising:
- a receiver receiving a signal vector corresponding to information bits and parity bits;
- a channel LLR distributor separating the received signal vector into two groups, a first group comprising signals corresponding to the information bits and one or more parity bits, and a second group corresponding to a remainder of the parity bits;
- a first decoder receiving the first group of signals;
- a second decoder receiving the second group of signals; and
- wherein the first and the second decoders iteratively decode the received signal vector by passing messages between the decoders, where the decoders are separated by an interleaver and a de-interleaver, and wherein the first decoder outputs an estimate of the information vector.

12. The apparatus of claim 11 wherein the first decoder is a repetition decoder.

13. The apparatus of claim 11 wherein the second decoder comprises a SPC-Accumulator decoder.

14. The apparatus of claim 11 wherein the interleaver and the de-interleaver are contention-free.

15. The apparatus of claim 11 wherein the signal vector corresponds to a codeword of a structured LDPC code using a structured parity-check matrix H with an expansion factor z, a base matrix $H_b$, and a model matrix $H_{bm}$.

16. The apparatus of claim 15 further comprising:
- a plurality of repetition decoders receiving copies of the first group of received signals; and
- a plurality of SPC-Accumulator decoders receiving copies of the second group of received signals, and wherein
- each repetition decoder has a same repetition factor $Q_b$ obtained from the base matrix $H_b$, and the output messages of the repetition decoders are sent to the interleaver;
- each SPC-Accumulator decoder has a same SPC parameter $J_b$ obtained from the base matrix $H_b$, and the output messages of the SPC-Accumulator decoders are sent to the de-interleaver.

17. The apparatus of claim 15 wherein the interleaver comprises
- a set $R_{bm}$ of shift sizes from the model matrix $H_{bm}$ for performing cyclic rotation within each message vector, and
- a Permuter (ρ) that is obtained from the base matrix $H_b$ to permute the message vectors.

18. The apparatus of claim 17 wherein
the cyclic shift of each individual message vector is an inter-window shuffling with a shuffle pattern $$\varphi_{\lfloor i/W \rfloor}(i\bmod W) = \left(R_{bm}(i\bmod W) + \left\lfloor \frac{i}{W} \right\rfloor\right)\bmod z,$$

where the window size W is equal to the length of ρ, and
the interleaver generates an output address π(i)=ρ(i mod W)+Wφ$_{\lfloor i/W \rfloor}$(i mod W) for an input i.

19. The apparatus of claim 15 wherein each SPC-Accumulator decoder corresponds to an SPC-Accumulator that accumulates to zero.

20. The apparatus of claim 15 wherein z=96 and $H_{bm}$=

```
-1 94 73 -1 -1 -1 -1 -1 55 83 -1 -1  7  0 -1 -1 -1 -1 -1 -1 -1 -1 -1 -1
-1 27 -1 -1 -1 22 79  9 -1 -1 -1 12 -1  0  0 -1 -1 -1 -1 -1 -1 -1 -1 -1
-1 -1 -1 24 22 81 -1 33 -1 -1 -1  0 -1 -1  0  0 -1 -1 -1 -1 -1 -1 -1 -1
61 -1 47 -1 -1 -1 -1 65 25 -1 -1 -1 -1 -1  0  0 -1 -1 -1 -1 -1 -1 -1 -1
-1 -1 39 -1 -1 -1 84 -1 -1 41 72 -1 -1 -1 -1 -1  0  0 -1 -1 -1 -1 -1 -1
-1 -1 -1 -1 46 40 -1 82 -1 -1 -1 79  0 -1 -1 -1 -1  0  0 -1 -1 -1 -1 -1
-1 -1 95 53 -1 -1 -1 -1 14 18 -1 -1 -1 -1 -1  0  0 -1 -1 -1 -1 -1 -1 -1
-1 11 73 -1 -1 -1  2 -1 -1 47 -1 -1 -1 -1 -1 -1 -1 -1  0  0 -1 -1 -1 -1
12 -1 -1 -1 83 24 -1 43 -1 -1 -1 51 -1 -1 -1 -1 -1 -1 -1  0  0 -1 -1 -1
-1 -1 -1 -1 -1 94 -1 59 -1 -1 70 72 -1 -1 -1 -1 -1 -1 -1 -1  0 -1  0 -1
```

-continued

```
-1 -1  7 65 -1 -1 -1 -1 39 49 -1 -1 -1 -1 -1 -1 -1 -1 -1 -1 -1  0  0
43 -1 -1 -1 -1 66 -1 41 -1 -1 -1 26  7 -1 -1 -1 -1 -1 -1 -1 -1 -1  0
``` and parameters
  $Q_b$=[3 3 6 3 3 6 3 6 3 6 3 6 3];
  $J_b$=[5 5 5 4 4 5 4 4 5 4 4 5];
  ρ=[15 36 49 0 5 32 1 16 19 28 33 45 10 29 46 11 23 37 6 12 24 38 41 50 7 20 34 8 13 25 39 42 51 2 17 47 3 18 21 30 35 48 22 31 43 9 14 26 40 44 52 4 27 53];
  $R_{bm}$=[61 12 43 94 27 11 73 47 39 95 73 7 24 53 65 22 46 83 22 81 40 24 94 66 79 84 2 9 33 82 43 59 41 55 65 39 83 25 41 14 47 49 72 18 70 12 0 79 51 72 26 7 0 7];
the inter-window shuffle interleaver is given by the permutation $\pi(i)=\rho(i \bmod 54)+54\phi_{\lfloor i/54 \rfloor}(i \bmod 54)$, where
  $0 \leq i < 5184 (=54 \times 96)$, [1], (17)

and the inter-window shuffle pattern φ is $$\varphi_{\lfloor i/54 \rfloor}(i \bmod 54) = \left(R_{bm}(i \bmod 54) + \left\lfloor \frac{i}{54} \right\rfloor\right) \bmod 96.$$

\* \* \* \* \*